United States Patent
Reilley (10) Patent No.: US 10,175,286 B1
(45) Date of Patent: *Jan. 8, 2019

(54) POWER LINE FAULT LOCATING SYSTEM (71) Applicant: Peter Reilley, Londonderry, NH (US)

(72) Inventor: Peter Reilley, Londonderry, NH (US)

( * ) Notice: Subject to any disclaimer, the term of this patent is extended or adjusted under 35 U.S.C. 154(b) by 348 days.

This patent is subject to a terminal disclaimer.

(21) Appl. No.: 14/868,284

(22) Filed: Sep. 28, 2015

(51) Int. Cl.
G01R 31/08 (2006.01)
G01R 31/02 (2006.01)
G01R 31/00 (2006.01)
G01R 31/28 (2006.01)
G01R 19/25 (2006.01)
H02H 1/00 (2006.01)

(52) U.S. Cl.
CPC ......... *G01R 31/088* (2013.01); *G01R 31/085* (2013.01); *G01R 19/2513* (2013.01); *G01R 31/001* (2013.01); *G01R 31/02* (2013.01); *G01R 31/08* (2013.01); *G01R 31/281* (2013.01); *H02H 1/0015* (2013.01); *Y04S 10/522* (2013.01)

(58) Field of Classification Search
CPC .... G01R 31/088; G01R 31/085; G01R 31/08; G01R 19/2513; G01R 31/001; G01R 31/02; G01R 31/281; Y04S 10/522; H02H 1/0015
USPC .......................................................... 702/59
See application file for complete search history.

(56) References Cited

U.S. PATENT DOCUMENTS

| 2,493,800 | A | 1/1950 | Biskeborn |
| 2,717,992 | A | 9/1955 | Weintraub |
| 3,462,681 | A | 8/1969 | Biskup |
| 4,866,391 | A | 9/1989 | Latham |
| 5,608,328 | A | 3/1997 | Sanderson |
| 5,729,145 | A | 3/1998 | Blades |
| 6,822,457 | B2 | 11/2004 | Borchert |
| 7,403,129 | B2 | 7/2008 | Zhou |
| 7,577,535 | B2 | 8/2009 | Anderson |
| 7,639,129 | B2 | 12/2009 | Bickel |
| 7,777,676 | B2 | 8/2010 | Bent |
| 7,869,810 | B2 | 1/2011 | Cutler |
| 7,965,193 | B2 | 6/2011 | Deaver |
| 8,049,668 | B1 | 11/2011 | Gines |
| 8,098,200 | B1 | 1/2012 | Gines |
| 2006/0187074 | A1* | 8/2006 | O'Sullivan .......... G01R 15/142 340/660 |
| 2010/0315092 | A1* | 12/2010 | Nacson ................ G01R 31/025 324/510 |
| 2011/0181295 | A1* | 7/2011 | Haugen ................ G01R 31/024 324/543 |

(Continued)

Primary Examiner — Ly D Pham (57) ABSTRACT

The Power Line Fault Locating System is a means of locating faults in a utility power system by sampling the noise at multiple positions around the system and correlating and summing the resulting data. When the processed data produces a spike, a noise source has been detected. The position of the spike in the data will indicate the location of the noise source with great precision. With three of more receivers the location of the fault can be determined in two dimensions. The invention can operate on both continuous noise resulting from minor flaws in the power system as well as the noise burst resulting from a power system failure. Noise resulting from minor flaws may come from slack line fittings, electrical leakage in insulators or at poles. A burst of noise may come from insulator flash over, lightning strike, or something contacting a power line.

18 Claims, 4 Drawing Sheets (56) References Cited

U.S. PATENT DOCUMENTS

| | | | |
|---|---|---|---|
| 2013/0121157 A1* | 5/2013 | Logvinov | H04L 41/0833 370/238 |
| 2016/0061862 A1* | 3/2016 | Nulty | G01R 15/06 324/127 |
| 2017/0141845 A1* | 5/2017 | Totten | H04B 10/0773 |

* cited by examiner

POWER LINE FAULT LOCATING SYSTEM

CROSS-REFERENCE TO RELATED APPLICATIONS

This application is a continuation in part (CIP) of application Ser. No. 13/594,807 filed on Aug. 25, 2012 which is hereby incorporated for all purposes.

CROSS-REFERENCE TO RELATED APPLICATIONS

Not Applicable

FEDERALLY SPONSORED RESEARCH

Not Applicable

SEQUENCE LISTING OR PROGRAM

Not Applicable

BACKGROUND OF THE INVENTION

Field of Invention

This invention relates to finding the location of a fault on a power line.

Prior Art

Electric utilities must monitor their transmission lines to insure their proper operation and prevent damage to their systems or customers equipment. Power outages can result from many different causes, some internal to the system such as equipment failure others from external causes such as a tree falling on a power line. In all cases the utility must find and repair the damage as rapidly as possible. Often the problem is quickly locating the point of failure. Utilities use many different devices to detect abnormal conditions in the power system. Devices currently in use measure the voltage and current on the power lines to insure if they are within normal limits. Should these devices detect a fault then a circuit breaker is opened and the line is protected from overload.

Some types of faults such as noise on the power lines are not detected by these devices. This noise may not indicate an immediate failure. The cause of the noise may not indicate a failure at all. The noise can go on for years. Such noise can emanate from arcing around mounting bolts and fixtures. These parts are very heavy and are not seriously damaged by the arcing. However, noise often indicates a fault with the equipment and can result in an eventual failure.

This noise, even if it is not a problem for the utility, can be a problem for other people in the area. It can disrupt radio communication, television reception, and other equipment. Above certain limits this noise can violate government restrictions on unintended radiation emissions. This can result in fines.

Noise emissions can be located using special wide bandwidth RF receivers and directional antennas such as equipment from Exacter Inc or Radar Engineers. With these devices a person must drive around searching for the strongest reception on his receiver. The receiver allows the operator to listen to the noise. Sometimes the noise has audio characteristics that can give a clue as to the type of fault. This is tedious, time consuming, and cannot be automated.

U.S. Pat. No. 7,777,676 describes a system for locating lightning strikes by using the time difference as measured by receivers at multiple points. This system is synchronized using GPS receivers. However this system depends on the lightning strike having a known waveform. This known waveform must have large enough amplitude to stand above the background noise. It will not work on signals buried in the noise. This patent, while not related to power lines, does describe relevant prior art.

U.S. Pat. No. 2,717,992 discloses a system where the impulse resulting from a transient fault is detected at each end of the power line. The two detectors communicate and produce graphical output that indicates the position of the fault on the power line. The graph shows the relative timing of the impulse. The difference in the arrival times is proportional to the distance to the fault.

U.S. Pat. No. 3,462,681 discloses a system that detects an electrical fault by sensing the disturbance wave as it travels to each end of the cable and senses the disturbance as it passes detectors connected to the ends of the cables and calculates the time difference of the arrival of the disturbance at the sensing points and thereby determines the location of the fault. This is a similar method to patent '992 in that it times the arrival of the impulse resulting from a fault.

An early U.S. Pat. No. 2,493,800 discloses a technique where a high voltage is applied to the power line. This voltage is high enough to cause a voltage breakdown. The timing of the resulting wave from the breakdown is measured at each end of the line. The result is shown on a CRT display as a pattern that indicates the position of the breakdown.

U.S. Pat. No. 6,822,457 discloses a system for locating faults on a power line but includes transmitters that apply a test signal to the line to determine its characteristics. This measures the propagation delay of the power line. This is an important factor in the calculation of the exact position of a fault. However, it can be impractical to inject a test signal on an energized line. Additionally, such test signals will also radiate and potentially disrupt radio communications.

U.S. Pat. No. 5,608,328 does attempt to locate an arcing fault. It does this by detecting the polarity of a high current fast rise time pulse. A portable detector is moved along the cable while the fault is occurring. Then the polarity of the pulse changes then the fault has been found. This system is not suitable for permanent installation and requires a fault pulse to work.

U.S. Pat. No. 7,577,535 describes an apparatus capable of determining the direction of a fault relative to the apparatus. It is a system that uses Fourier analysis to extract the frequencies of interest. It is useful in locating arcing faults that have not yet resulted in a system outage. However it is not able to determine the distance to the fault rather it is a mobile device that locates the fault by moving along the path of the power line.

U.S. Pat. No. 7,869,810 issued Jan. 11, 2011 to Agilent is written toward locating signal sources in an office environment. This claims an iterative process of adjustments to the map to improve its quality in the presence of multipath reflections. Since they are searching for an emitter operating in a known frequency band they cannot choose an optimal band to reduce such reflections.

U.S. Pat. No. 8,049,668 issued Nov. 1, 2011 to Agilent attempts to locate a device emitting an RF signal, likely a WiFi device or cell phone, in an office environment by calculating weights and residuals. The estimate for the location of the emitter is updated in an iterative manner that improves the estimate.

U.S. Pat. No. 8,098,200 issued Jan. 17, 2012 to Agilent attempts to locate a RF emitter using a likelihood function.

Such an emitter is likely a WiFi device or cell phone. The likelihood value is determined for each position on a grid. The position where the likelihood value is the greatest is the estimated position of the emitter.

OBJECTS AND ADVANTAGES

The present invention solves these problems because it does not depend on the fault signal having any recognizable characteristics. It need not be an impulse; the fault can be a noise like signal. When an autocorrelation is performed on a noise waveform the resulting correlation graph will have a peak only at zero offset. Noise, being random, will not correlate at any other offset It is this characteristic of the autocorrelation function that allows the present invention to work. Further, the fault signal amplitude need not stand above the background noise; the correlation will extract the fault noise and its position even if it is embedded in the background noise This characteristic of the correlation function is called process gain.

The present invention addresses these issues;
1. Precise location of a noise source.
2. Able to operate at a long distance from the origin of the noise.
3. The invention continuously monitors power lines for faults.
4. Can be connected into the existing power line protection systems.
5. Completely automated.
6. Does not depend on detecting an event but rather extracts location information from a noisy set of data.
7. Able to locate faults that current systems cannot detect.
8. Will operate on AC or DC power lines.
9. Avoids problems with signal blockage or multi-path reflection effects.

SUMMARY

The Noise Source Locating System has significant advantages over the existing systems. It is able to locate an arcing fault without having detectors connected to the power lines; rather the system receives the radiated electromagnetic emissions through the air. The location is found by correlating the data received from multiple detectors. The correlation data along with precise timing data provides the physical distance to the fault. The data is not expected to have any recognizable pattern; rather it is expected to have the random characteristic of noise. Noise, by definition, is not predictable and has no pattern. Indeed it is one of the key facts that allows the present invention to work.

It is a further advantage of the present invention that it does not connect to the power lines. Rather it senses the radiated RF energy produced by a fault and does this from a distance. This makes installing the system easier and safer. The power lines need not be taken out of service.

An additional advantage is that the present invention does not depend of detecting a pulse or any signature of the received RF radiation. The RF radiation is assumed to be completely random and similar to white noise. The received RF radiation may be continuous or a single burst.

The present invention is much more efficient with its system resources. The sensors cover an area rather than being attached to individual power lines. Thus, in a heavily populated area with many circuits, the number of sensors in not increased. Alternate systems have a sensor per wire get very complicated and expensive in such environments.

One of the essential features of the present invention is the signal gain resulting from the correlation function that enhances the signal strength of a particular noise emitter over the general background noise. This is similar to the process gain characteristic of direct sequence spread spectrum communication systems. With this feature the present invention is able to accurately locate a noise emitter whose signal power is not strong relative to the background noise.

DETAILED DESCRIPTION—LIST OF DRAWING ELEMENTS

10. Utility poles
11. Utility pole cross members.
12. Power lines.
21. Receiving units.
22. GPS antennas.
25. Receiving antennas.
27. Location of fault.
40. Filter/amplifier.
41. Sampling unit.
42. Memory.
43. Communication unit.
44. Global Positioning System (GPS) receiver.
45. Receiving antenna.
46. GPS antenna.
47. Outgoing communication link.
60. Incoming data from the monitoring units.
62. Communication receiver.
63. Analysis Unit.
64. Plot of correlation results.
65. Correlation background noise.
66. Correlation peek.
67. Correlation graph.
68. Distance scale.
69. Communication channel for correlation data.
80. Heatmap summing unit.
81. Communication channel to receive correlation data.
82. Heatmap result.
83. Heatmap data for users.
85. Heatmap graph showing utility poles.
86. Latitude scale of graph.
87. Longitude scale of graph.
88. Positions of utility poles.
89. Position of receiving unit.
90. Position of receiving unit.
91. Position of receiving unit.
92. Position of fault.
100. Hyperbolic curve.
101. Hyperbolic curve.
102. Hyperbolic curve.
103. Heatmap showing the hyperbolic curves.
104. Location of fault.

DETAILED DESCRIPTION OF PREFERRED EMBODIMENTS

While the present invention will be described more fully hereinafter with reference to the accompanying drawings, in which aspects of the preferred manner of practicing the present invention are shown, it is to be understood at the outset of the description which follows that persons of skill in the appropriate arts may modify the invention herein described while still achieving the favorable results of this invention. Accordingly, the description which follows is to be understood as being a broad, teaching disclosure directed to persons of skill in the appropriate arts, and not as limiting upon the present invention.

Figure 1:
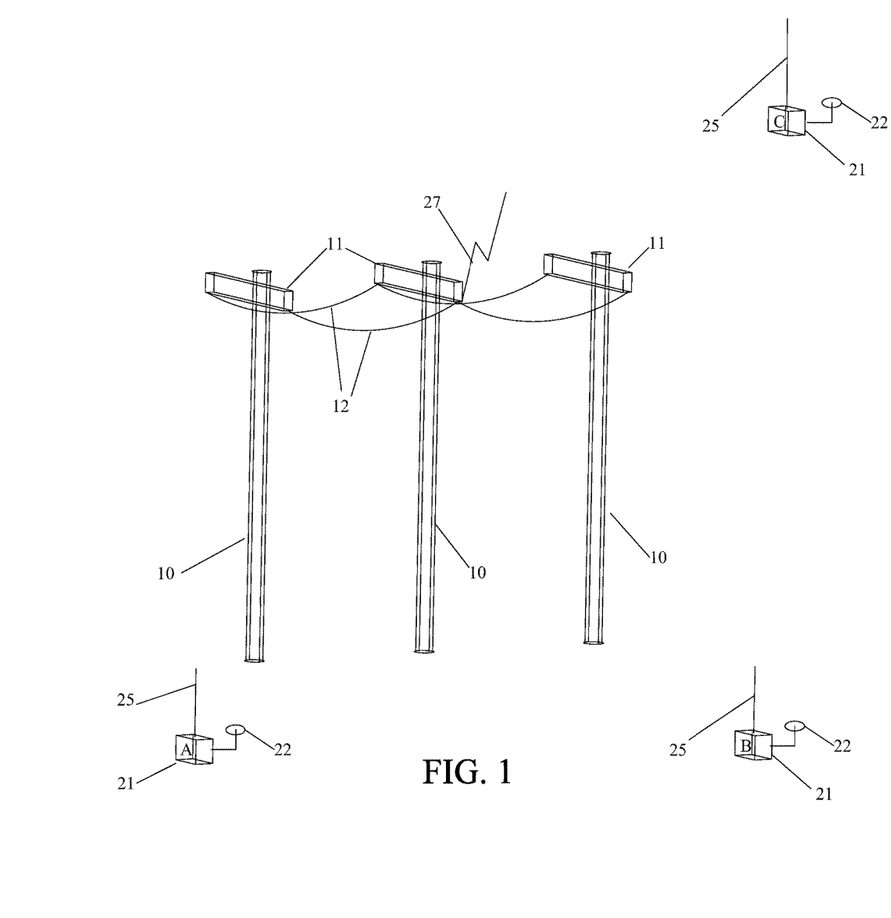
FIG. 1 This shows a typical power line installation with three sensing devices installed.

Detailed Description—FIG. 1

FIG. 1 shows a typical power line installation. There are a series of utility poles 10 with their cross-members 11. The power lines being monitored are shown 12. There are three monitoring units 21 spaced around the power lines but at a distance from them. The three nodes 21 are labeled A, B, and C. Each of the monitoring units 21 has a receiving antenna 25. In this embodiment each monitoring unit has a global positioning system (GPS) antenna 22. There may be more than three monitoring units used in a power system that work cooperatively but for this embodiment we will consider only three.

An arcing fault 27 is shown involving one of the wires 12. This could be the result an insulator that has failed or a tree falling on the line. The arc results in plasma forming around the electric current flow through the air. It is this plasma that causes the electromagnetic radiation. This radiation propagates outward from the fault at the speed of light. The radiation will be picked up by the antennas attached to the monitoring units 21 but with a time delay proportional to the distance of the monitoring node from the fault location.

The preferred method of sensing the electromagnetic radiation is with a whip antenna 25. A whip antenna senses the electric field part of the electromagnetic radiation. Another electromagnetic radiation sensing method would be to use a loop antenna. This would sense the magnetic part of the radiated field.

FIG. 1 shows only three utility poles but an actual installation would likely have many more. Even though utility poles are shown in the drawings this invention is not limited to low voltage distribution of conventional utility poles, it will work equally well on high voltage power transmission lines.

The present invention requires that time be synchronized between the sampling points represented by the three monitoring nodes 21. In FIG. 1 this is accomplished by using GPS receivers at each monitoring node 22. One of the features in many GPS receivers is an accurate time marker pulse. These receivers provide a pulse that occurs once a second and can be accurate to 20 nano seconds or better.

Synchronizing the monitoring units can also be accomplished by other means such as a communication network with known timing characteristics. Power line installations often include a fiber optic cable that is used for communications with monitoring and protection equipment. This cable would have known timing characteristics and could provide the necessary synchronizing information. It is the accuracy of timing that determines the precision with which the noise source can be located. This is not shown because the GPS timing method is a preferred embodiment.

Figure 2:
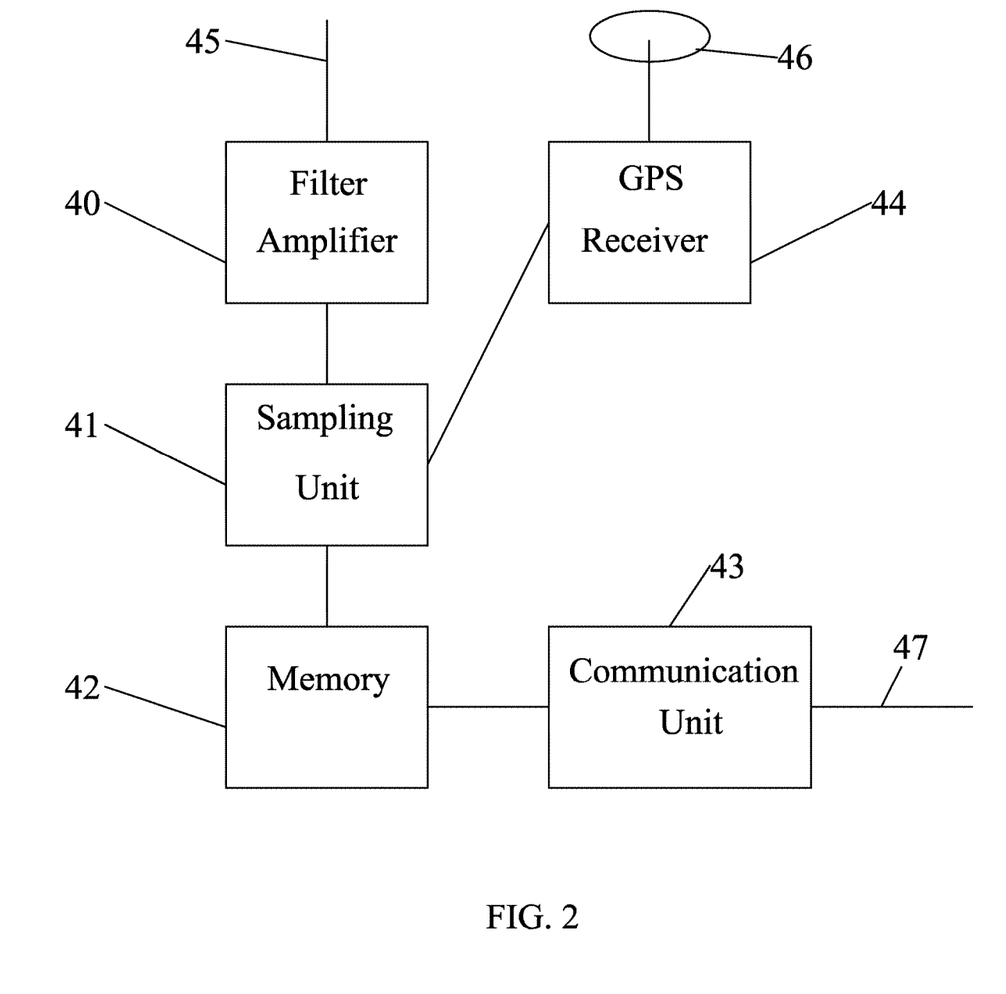
FIG. 2 This shows the major elements of each sensing device. The signal flow is shown as connections between each of the elements.

Detailed Description—FIG. 2

FIG. 2 shows the elements in each monitoring unit 21. The noise signal detected at the antenna 45 is first filtered and amplified 40 then delivered to the sampling unit 41. The sampling unit 41 uses an analog to digital converter to sample the voltage of the noise signal at a high rate of speed. The sampling unit 41 is synchronized with timing information from the GPS unit 44. The resulting sampled data is saved in memory 42. When the sampling period is over, the communication unit 43 sends the data and timing information over the communication channel 47 to the processing unit.

The filter and amplifier unit 40 limits the high frequency component of the noise signal detected from the antenna 45. It is necessary to limit the bandwidth of the noise to below the Nyquist limit of the sampling unit. Otherwise higher frequency components in the noise will reflect down into the bandwidth of interest and degrade the final correlated data. The amplification function adjusts the level of the noise signal to be compatible with the sampling unit input. The amplifier may be a logarithmic amplifier, a limiting amplifier, or have other characteristics that match the signal level to the dynamic range of the sampling unit.

The rate of sampling is determined by the highest frequency of interest. That is, the sampling frequency must be at least double the frequency of the highest frequency of interest contained in the noise. The highest frequency of interest will likely be below 100 MHz. Frequencies higher than 100 MHz suffer attenuation through trees and are degraded by reflection effects from buildings and other structures. Therefore, removing higher frequencies may remove very little useful information. If only noise signals below 100 MHz are used then a sampling rate of no less then 200 mega-samples per second is suitable. This results in a Nyquist limit of 100 MHz. The filter/amplifier 40 should be designed to pass frequencies below 100 MHz only.

The timing of the sampling of the noise signal must be carefully controlled. The timing will be controlled by the Global Positioning System (GPS) receiver 44. The GPS receiver has an antenna 46 to receive the satellite signal. The GPS receiver 44 will provide precise timing signals to the sampling unit 41. GPS receivers are capable of generating a timing pulse at 1 pulse per second that is precise to 20 nano-seconds or better. They also provide the time of day at the same precision. The pulse is used to trigger the sampling unit which then begins sampling at 200 mega-samples per second until the sampling interval is over. The length, in units of time, of the sampling interval should be at least 2 times the propagation delay between the receiving units of the covered area. The use of the term GPS is used to mean any radio frequency timing system and not only the Global Positioning System.

The sampled data and the timing information will be stored in memory 42. The memory 42 will hold the data until the sampling period is complete. The size of the memory is dependent on the distance between the receiving units in the monitoring system. The memory should hold at least 2 times the propagation length. If, for example, the nodes are spaced at 10 miles and the sample rate is 200 mega-samples per second then the memory must hold at least 212,000 samples. This is assuming a propagation speed of about 1 foot per nano-second.

When the sampling process has completed the data and timing information from the memory 42 will be sent to the data analysis unit by communication device 43 using the outgoing communication link 47. The communication channel can be a radio link, a direct connection such as a fiber optic cable, or over the internet. The timing characteristics of this data communication link 47 is not important since the critical timing data is stored in the memory 42 along with the sampled data.

Figure 3:
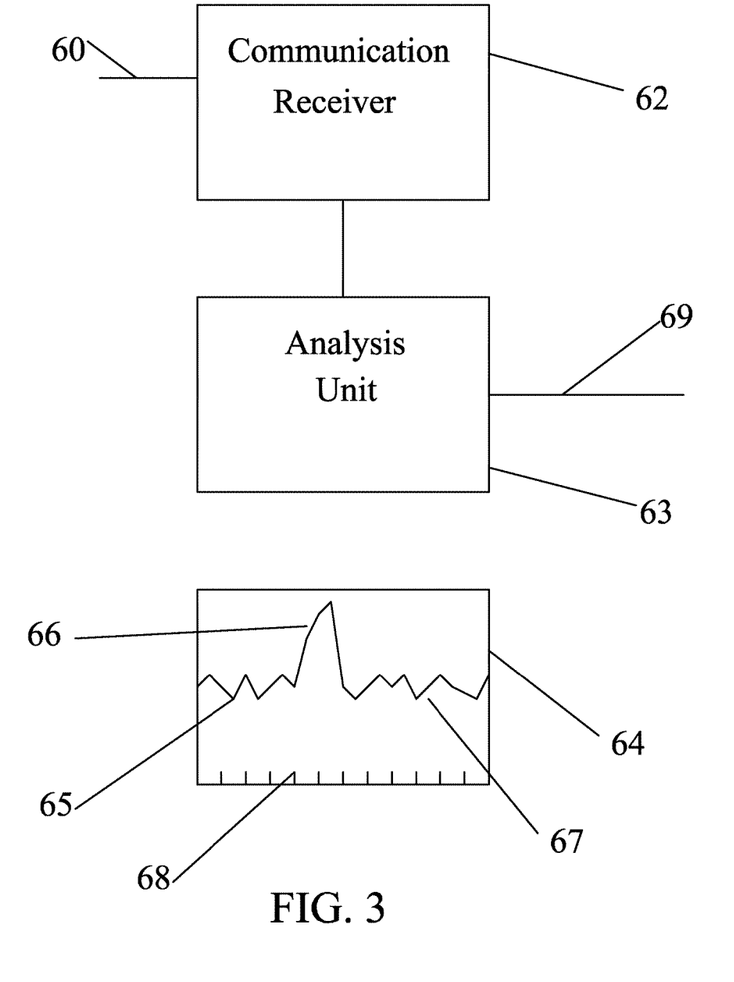
FIG. 3 This shows major elements of the correlation device and the presentation of the results to the user. This is where all the data from all the sensing elements is collected.

Detailed Description—FIG. 3

FIG. 3 shows the data analysis unit. This combines a communication receiver 62 with a data processing unit 63 and a chart showing the correlation results 64. The data produced by the monitoring units 21 is received on the incoming communication channel 60. The communication receiver 62 forwards the data to the analysis unit 63. There can be multiple data analysis units but in this example we will describe only one.

The analysis unit 63 takes the data from each pair of monitoring units and performs a cross-correlation analysis. All of the nodes in the covered area will be grouped into pairs; each of these pairs will have their data correlated. This results in the time difference of arrival (TDOA) data.

The range of the cross-correlation is from −T to +T. Where "T" is the distance between the two nodes in terms of samples. That is, the time for a signal to travel from one monitoring unit 21 to the other monitoring unit 21. For example; if the distance between the monitoring units is 10 miles, it will take about 53 microseconds for a signal to travel from monitoring unit A to monitoring unit B and at the sample rate of 200 mega-samples per second then T is about 106,000.

The length of the sample period should be at least 2 T. The correlation function has the property of amplifying localized noise sources but to not amplify general background noise. This is called process gain. A longer sampling period results in even greater gain for localized noise sources. This is the origin of process gain that the present invention uses to extract the arcing noise signal from the background noise. Process gain is sometimes called coding gain.

The cross-correlation function will produce the correlation data and is described by the discrete correlation function;

$$C(t) = \sum_{-T}^{T} A[t]B[T-t]$$

The data analysis unit 63 sends the cross-correlated data shown on chart 64. The chart 64 plots the data as a graph 67. The X axis of the graph 67 represents the distance between two nodes and is based on t. The X axis is demarked in distance 68 that represents the distance from one node to the other.

The Y axis represents the amplitude of the noise detected. In this graph 67 there is a position where a high level of noise 66 is detected. This spike 66 rises above the noise floor 65. Such a graph 67 could indicate an arcing fault. The position of the spike 66 as measured on the scale 68 is related to the position between the two nodes. The spike in the in the correlated data from multiple monitoring units is used to triangulate to the position of the fault this is well known locating methodology.

Figure 4:
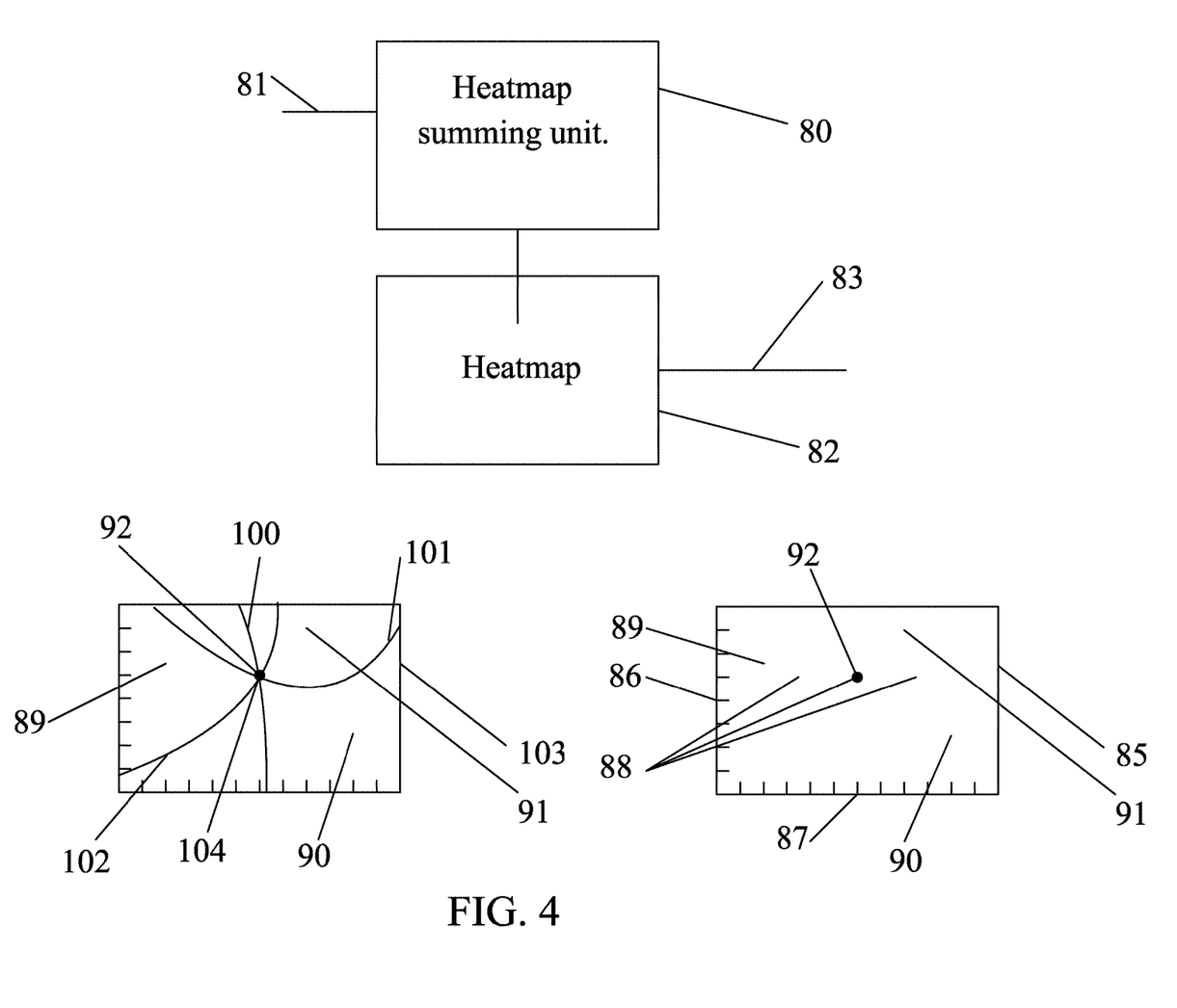
FIG. 4 This shows the process for locating the fault. The heatmap is generated from the correlation data generated in FIG. 3.

Detailed Description—FIG. 4

FIG. 4 shows the process where the heatmap is created. It is the heatmap that allows the position of the fault to be located in terms of latitude and longitude.

The heatmap summing unit 80 receives the correlation data from the analysis units 63. All the receiver pairs that are in the local area should have their data included in the summing process. Receiver pairs that are too far away need not be considered since the signals would be too weak. This is an important factor in limiting the computational load.

Chart 103 illustrates the process where the correlation data sets are summed to produce the heatmap. The chart shows the position of the three receivers 89, 90, 91. The chart scales 86 and 87 are in terms of latitude and longitude. The positions of the utility poles are shown 88. There are two charts shown 85 and 103 but they are actually one, they are shown as two to avoid clutter.

The correlation data set for a pair of receivers describes a family of hyperbolic curves. Each hyperbolic curve is described by a specific time difference of arrival value. For example, the hyperbolic curve 102 represents a particular peak in the correlation data set from receiver 89 and 90. The curve 101 results from a particular peak in the correlation data set from receivers 90 and 91. Finally the curve 100 results from a particular peak in the correlation data set from receivers 89 and 91. The intersection of the curves 104 indicates the location of the fault.

Although this specification describes a certain embodiment the present invention is nevertheless not intended to be limited by the described details. Rather the invention described in the specification is only one possible implementation within the scope of the claims.

I claim:

1. A device for finding the location of a fault in an electric power grid by detecting the radio frequency emissions that result from an arcing fault comprising:
    a. three or more data collection units at known locations producing sampled data, wherein said data collection units operate at radio frequencies selected to reduce multipath reflections and radio frequency blocking effects, wherein said data collection units sense said radio frequency emissions produced by said arcing fault, wherein said data collection units include antennas that detect said radio frequency emissions, wherein said antennas are sensitive to a wide range of frequencies, wherein said data collection units are positioned away from said power grid by at least 10 meters, and
    b. multiple communication devices, and
    c. multiple synchronizing devices, and
    d. one or more correlating devices for producing correlated data from which time difference of arrival data is determined, and
    e. one or more location processing devices using said time difference of arrival data to determine the fault location in two or more dimensions, and
    f. a device for presenting said fault location to a user or monitoring system, and
    g. said fault location presented as map coordinates or as a heat map,
    wherein said sampled data from said data collection units is synchronized using said synchronizing devices and is communicated to said correlating device or devices and said correlated data is used to determine said time difference of arrival data which is processed by said location processing devices producing said fault location and which is then presented to said user or said monitoring system.

2. The device of claim 1 wherein said synchronizing devices are Global Positioning System receivers.

3. The device of claim 1 wherein said synchronizing devices are communication links.

4. The device of claim 1 wherein there is one or more memory units to store said sampled data.

5. The device of claim 1 wherein said data collection units sense said electromagnetic emissions by detecting the electric field part of said emissions.

6. The device of claim 1 wherein said data collection units sense said electromagnetic emissions by detecting the magnetic field part of said emissions.

7. The device of claim 1 wherein there is a filter to prevent aliasing effects in said data collection units.

8. The device of claim 1 wherein the power line may be alternating current or direct current.

9. A method for finding a location of an electrical fault in an electric utility service area comprising the steps of:
   a. collecting sampled data at three or more sample locations in said service area, wherein said sampled data represents radio frequency emissions given off by said electrical fault, wherein said sample locations not less than 10 meters away from utility equipment in said electric utility service area, wherein, wherein using antennas sensitive to the electromagnetic emissions resulting from said electrical fault, wherein said antennas are sensitive to a wide range of frequencies,
   b. synchronizing said sampled data with one or more time references to produce synchronized data,
   c. communicating said synchronized data to one or more processing units using communication links,
   d. correlating said synchronized data to produce correlated data;
   e. extracting time difference of arrival data from said correlated data,
   f. processing said time difference of arrival data to produce a heatmap and/or fault location coordinates, and
   g. presenting said heatmap and/or location coordinates to one or more users or monitoring systems wherein said heatmap and/or location coordinates indicates the location of said fault.

10. The method of claim 9 including the step of obtaining said time references from a Global Positioning System.

11. The method of claim 9 including the step of obtaining said time references from said communication links between said data collection points.

12. The method of claim 9 including the step of collecting data using analog to digital converters.

13. The method of claim 9 including the step of reducing aliasing in said collected data by using a filter.

14. An apparatus for locating an electrical fault or faults in an electric utility service area comprising,
   a. multiple analog to digital converters positioned at a distance of not less than 10 meters from electric utility equipment that sample the electromagnetic radiation originating from said electrical faults producing sampled data, wherein said analog to digital converters include antennas sensitive to said electromagnetic radiation, wherein said analog to digital converters operating in a frequency band or bands selected to reduce multipath and signal blocking effects, wherein said analog to digital converters detect a wide range of frequencies in said electromagnetic radiation,
   b. synchronizers that process said sampled data using time reference signals to produce synchronized data,
   c. communicators that send said synchronized data a computer or computers, and
   d. said computer or computers perform correlation on said synchronized data to produce correlated data, wherein said correlated data is processed to produce time difference of arrival data, wherein said computer determines the location of said electrical fault or faults using said time difference of arrival data wherein the location of said electrical fault or faults is presented to one or more users or monitoring systems as either location coordinate data or as a heatmap.

15. The apparatus of claim 14 wherein said synchronized data uses Global Positioning System.

16. The apparatus of claim 14 wherein said analog to digital converters receive said electromagnetic radiation using an antenna sensitive to electric fields.

17. The apparatus of claim 14 wherein said analog to digital converters receive said electromagnetic radiation using an antenna sensitive to magnetic fields.

18. The apparatus of claim 14 wherein there is a filter to prevent aliasing effects in said analog to digital converters.

* * * * *